(12) United States Patent
Sato et al.

(10) Patent No.: US 6,707,309 B2
(45) Date of Patent: Mar. 16, 2004

(54) SEMICONDUCTOR DEVICE-SOCKET

(75) Inventors: Masaru Sato, Yokohama (JP); Hiroyuki Kitada, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 44 days.

(21) Appl. No.: 10/180,012

(22) Filed: Jun. 26, 2002

(65) Prior Publication Data

US 2003/0001600 A1 Jan. 2, 2003

(30) Foreign Application Priority Data

Jun. 27, 2001 (JP) .................................... 2001-195417

(51) Int. Cl.[7] .............................................. G01R 31/02
(52) U.S. Cl. ...................... 324/755; 324/758; 439/259
(58) Field of Search ................................ 324/754–756, 324/758, 761–762, 765; 439/259, 264, 266, 268, 330

(56) References Cited

U.S. PATENT DOCUMENTS

| 5,955,888 A | * | 9/1999 | Frederickson et al. ...... 324/761 |
| 6,149,449 A | | 11/2000 | Abe |
| 6,541,991 B1 | * | 4/2003 | Hornchek et al. .......... 324/755 |
| 6,609,923 B2 | * | 8/2003 | Sato et al. .................. 439/259 |

FOREIGN PATENT DOCUMENTS

JP          3059946         4/2000

* cited by examiner

Primary Examiner—Kamand Cuneo
Assistant Examiner—Minh N. Tang
(74) Attorney, Agent, or Firm—Finnegan, Henderson, Farabow, Garrett & Dunner LLP

(57) ABSTRACT

An accommodation portion for a semiconductor device to be mounted is formed of an accommodation portion of a positioning member that is restricted in its position to a socket body and supported on the same, and an accommodation portion of a positioning member that is supported on the socket body relatively movably with respect to the socket body.

8 Claims, 14 Drawing Sheets

SEMICONDUCTOR DEVICE-SOCKET

This application is based on Patent Application No. 2001-195417 filed Jun. 27, 2000 in Japan, the content of which is incorporated hereinto by reference.

BACKGROUND OF THE INVENTION

1. Field of the Invention

The present invention relates to a semiconductor device-socket useable for testing a semiconductor device.

2. Description of the Related Art

Semiconductor devices mounted on an electronic equipment or others are subjected to various tests at a stage prior to being actually mounted so that latent defects therein are removed. The test is performed nondestructively through application of voltage stress, high-temperature operation, and high-temperature storage corresponding to thermal and mechanical environment tests or the like. Among these tests, there is a burn-in test effective for removing initial-inoperable integrated circuits, in which an operation test is performed under a high temperature condition for a predetermined time.

A semiconductor device-socket subjected to such a test as disclosed in Japanese Patent No. 3059946 and as illustrated in FIG. 11, for example, is disposed on a printed circuit board 2 that includes an input/output portion, to which portion a predetermined test voltage is supplied and which portion outputs an abnormality-detection signal representing a short-circuit or others is returned from the semiconductor device as an object to be tested and the abnormality detection signal is transmitted.

The semiconductor device-socket comprises a socket body 4 for accommodatinging the contact deviation member 8 relatively movably with respect to a pair of the contact portion of the contact terminal 16ai; a positioning member 10 including an accommodation portion 10a in which a BGA-type (Ball Grid Array) semiconductor device is loaded as the semiconductor device for example; a contact deviation member 8 for supporting the positioning member 10 arranged in a socket body 4 movably as described later in a reciprocating fashion in a predetermined direction and bringing one of movable contact portion 16M of a contact terminal 16ai described later into close proximity to the other of contact portion 16F or keeping the one away from the other; and a frame member 12 for transmitting operation force acting on itself to the contact deviation member 8 through a driving mechanism of the contact deviation member 8 (not shown).

At a predetermined position on the printed circuit board 2 are formed a group of electrodes connected electrically to the input/output portion through a conductor layer. To the electrode group is connected a terminal 16B on a proximal end side of a plurality of the contact terminals 16ai (i=1 to n, n is a positive integer.) provided on the socket body 4 disposed on the printed circuit board 2.

The socket body 4 has thereinside an accommodation portion 4a from which the movable contacts 16M and 16F of a plurality of the contact terminals 16ai are protruded.

Each contact terminal 16ai, which is provided corresponding to each electrode portion 6a of a mounted semiconductor device 6, comprises a terminal 16B on the side of the proximal end and a pair of movable contact portions 16F and 16M that are coupled with the just-mentioned terminal 16B for selectively supporting each electrode portion 6a of the semiconductor device 6. The pair of the movable contact portions 16F and 16M approach each other in response to the movement of the contact deviation member 8 to pinch each electrode portion 6a of the semiconductor device 6 or are separated from each other to release each electrode portion 6a of the semiconductor device 6 as shown FIG. 13 and FIG. 14.

The contact deviation member 8 is disposed movably in the movement direction of the movable contact portions 16M and 16F of each contact terminal 16ai in the accommodation portion 4a of the socket body 4. The contact deviation member 8 has an opening through which the movable contacts 16M and 16F of each contact terminal 16ai are protruded. Each opening is divided with a partition wall (not shown).

A partition wall 8p is provided as a movable contact press portion, in each opening portion from which the movable contacts 16M and 16F of each contact terminal 16ai in the contact deviation member 8 are protruded, which portion 8p is formed so as to divide a space between the movable contact 16M and the movable contact 16F. Further, between the one end of the contact deviation member 8 and the inner periphery of the accommodation portion 4a of the socket body 4 is provided an urging member (not shown) for urging the contact deviation member 8 to return the contact deviation member 8 to an initial position illustrated in FIG. 11.

As shown in FIG. 13, a recessed portion 8a is provided in an upper end of the contact deviation member 8 on which a bottom of the positioning member 10 of the contact deviation member 8 is placed, with which a protrusion 10p of the positioning member 10 is engaged when the contact deviation member 8 is moved in one direction. As shown therefore in FIGS. 12 and 13, the contact deviation member 8 is adapted to be relatively slidable in a predetermined region with respect to the bottom of the contact deviation member and the positioning member 10, and is moved together with the positioning member 10.

The contact deviation member 8 is coupled to a driving mechanism composed of a pin and a lever as disclosed in the foregoing Japanese Patent No. 3059946. One end of the lever of the driving mechanism makes contact with an end of the frame member 12.

Accordingly, when the contact deviation member 8 is moved against the urging force of the coiled spring 14 in the direction indicated by an arrow illustrated in FIG. 13 in response to the lowering operation of the frame member 12 in the direction indicated by an arrow in FIG. 11, the partition wall 8P is moved so as to separate the movable contact portion 16M of each contact terminal 16ai from the movable contact 16F. In contrast, as shown in FIG. 14, the contact deviation member 8 is moved with the aid of the urging force of the biasing means and the restoring force of the movable contact 16M oppositely to the direction indicated by the arrow in FIG. 13 in response to rising operation of the frame member 12.

As shown in FIG. 11, the positioning member 10 includes the accommodation portion 10a at the center thereof, in which the semiconductor device 10 is mounted. An inner peripheral surface of the accommodation portion 10a comprises flat surfaces with which end surfaces of the square semiconductor device 6 make contact, and a slope that combines the upper end surface and the flat surface, and further a bottom surface intersecting the flat surface. The size of the inner peripheral surface of the accommodation portion 10a is set larger than the size of an external appearance of the mounted semiconductor device 6 mounted within a predetermined tolerance.

In the bottom of the accommodation portion 10a is formed an opening lob communicated with the opening in the contact deviation member 8. The protrusion 10p that engages a peripheral edge of the recessed portion 8a of the contact deviation member 8 is formed at a portion of the bottom of the accommodation portion 10a opposing to the contact deviation member 8. Further, protrusions 10ca and 10cb are formed on both ends of the bottom of the positioning member 10 on the opposite side of the socket body 4, the protrusions being guided and restricted by grooves 4ga and 4gb in the socket body 4.

The frame member 12 has thereinside an opening to surround an outer periphery of the positioning member 10. The frame member 12 is supported on the socket body 4 movably up and down with respect to the socket body 4.

When in such a structure, referring to FIG. 11, the semiconductor device 6 is in the state just before it is held with the hand HA of the conveyance robot (not shown) and is accommodated in the accommodation portion 10a of the positioning member 10, the semiconductor device 6 is held with the hand HA of the conveyance robot such that an axis center of the hand HA of the conveyance robot and the center of the semiconductor device 6 are coincident with each other. In that case, the protrusion 10p of the positioning member 10 and the peripheral edge of the recessed portion 8a of the contact deviation member 8 are made a disengagement state each other. Further, the hand HA of the conveyance robot is disposed such that the position of the axis center of the hand HA is displaced by a predetermined distance ΔH to the left in FIG. 11 with respect to the center position of the accommodation portion 10a of the positioning member 10.

When the held semiconductor device 6 is mounted in the accommodation portion 10a of the positioning member 10, the frame member 22 is first moved downward up to a lowest end position illustrated in FIG. 13 with the press portion PU of the conveyance robot and the semiconductor device 6 is moved downward.

Accordingly, referring to FIG. 13, the contact deviation member 8 is moved against the urging force of the urging means. Further, the protrusion 10p of the positioning member 10 and the peripheral edge of the recessed portion 8a in the contact deviation member 8 are brought into an engagement state, whereby the positioning member 10 is moved until the protrusion 10ca and 10cb of the positioning member collide with closed ends of the grooves 4ga and 4gb, respectively.

Next, referring then to FIG. 13, in the state of the partition wall 8P where it is moved and held such that the movable contact 16M of the each contact terminal is separated from the movable contact 16F, the semiconductor device 6 is mounted in the accommodation portion 10a of the positioning member 10, whereby the electrode 6a of the semiconductor device 6 is positioned between the movable contact 16M or and movable contact 16F of each contact terminal 16ai.

Since in that case the accommodation portion 10a of the positioning member 10 is moved by a predetermined distance, the hand HA of the conveyance robot is moveed downward as indicated by a chain double-dashed line in FIG. 13 in response to the movement of the positioning member 10 in the state where the position CL of the axis center of the hand HA and the center position of the accommodation portion 10a of the positioning member 10 are coincident with each other.

When the frame member 12 is moved upward as illustrated in FIG. 14 in the state where each electrode 6a of the semiconductor device 6 is disposed between the movable contacts 16M and 16F of each contact terminal 16ai, the contact deviation member 8 is moved up to the initial position with the aid of the urging force of the urging means and the restoring force of the movable contact 16M, whereby the partition wall 8P is separated from the movable contact 16M and comes in contact with the movable contact 16F. It is here noticed that FIG. 14 illustrates the situation of the contact deviation member 8 where it starts to move in the direction indicated by an arrow.

Referring to FIG. 14, each electrode 6a of the semiconductor device 6 is therefore held between the movable contact 16M of each contact terminal 16ai and the movable contact 16F of the same to bring the electrodes 6a of the semiconductor device 6 into an electrical connection with each contact terminal 16ai.

There is however a situation where any end of the semiconductor device 6 interferes with the inner periphery of the accommodation portion 10a of the positioning member 10 owing to a positional displacement of the positioning member 10 based upon manufacturing error of respective constituent parts associated with the positioning member 10 during the movements of the hand HA of the conveyance robot, the frame member 12, and the positioning member 10, as illustrated in FIG. 12.

Such a problem can be eliminated provided that the frame member 12 is lowered up to a lowest end position and the positioning member 10 is moved until the protrusions 10ca and 10cb collide open ends of the grooves 4ga and 4gb, and then the hand HA of the conveyance robot that holds the semiconductor device 6 is moved with a delay, as illustrated in FIG. 13, for example. But this causes another problem of reducing of inspection efficiency and hence the just-mentioned method is inadvisable.

It is furthermore difficult in mass production in view of production efficiency to replace a new respective constituent parts associated with the positioning member 10 for correcting the positional displacement of the positioning member 10. There is a predetermined limit to reduce the amount of the positional displacement of the positioning member 10 because there is the possibility of the positional displacement being varied within a range of variations of manufacturing error of each parts among lots.

SUMMARY OF THE INVENTION

In view of the drawbacks with the prior art it is an object of the present invention to provide a semiconductor device-socket used for a test for a semiconductor device wherein during a series of mounting operations or a semiconductor device there is no possibility of undesirable interference between a positioning member and the semiconductor device, and further no possibility of reducing of inspection efficiency.

To achieve the above object, a semiconductor device-socket according to the present invention comprises: a supporting member for supporting a proximal end of a contact terminal including a movable contact selectively making contact with terminals of the semiconductor device to be electrically connected therewith; a contact terminal deviation member disposed movably in the supporting member and including a press portion for bringing the movable contact of the contact terminal into or out of close proximity to the terminal of the semiconductor device; a first positioning member supported on said supporting member with the movement in the direction of the movement of the contact terminal deviation member restricted, and the first positioning member including a accommodation portion for positioning the terminal of the mounted semiconductor device relatively with respect to the movable contact of the contact terminal; and a second positioning member opposing to the first positioning member and supported on the supporting member movably in the direction of the movement of the contact terminal deviation member, the second positioning member including a accommodation portion for positioning the terminal of the mounted semiconductor device relatively with respect to the movable contact of the contact terminal cooperatively with the first positioning member.

The foregoing second positioning member may be adapted such that it includes an engagement portion for selectively engaging the contact terminal deviation member when the contact terminal deviation member is moved, and it is moved so as to bring into or out of close proximity to the first positioning member.

A semiconductor device-socket according to the present invention comprises: a supporting member for supporting a proximal end of a contact terminal including a movable contact selectively making contact with a terminal of the semiconductor device to be electrically connected therewith; a contact terminal deviation member disposed relatively movably in the supporting member, the contact deviation member including a press portion for bringing the movable contact of the contact terminal into or out of close proximity to the terminal of the semiconductor device; a positioning member supported on a supporting member with the movement in the direction of the movement of the contact terminal deviation member restricted, the positioning member including an accommodation portion for relatively positioning the terminal of the semiconductor device relatively movably with respect to the movable contact for accommodation of the semiconductor device; and a position restriction member for restricting the movement of the positioning member in the direction of the movement of the contact terminal deviation member when the semiconductor device is mounted on the accommodation portion of the positioning member.

The position restriction member may be a resilient member for urging the positioning member in one direction along the movement direction of the contact terminal deviation member.

A semiconductor device-socket according to the present invention comprising: a supporting member for supporting a proximal end of a contact terminal including a movable contact selectively making contact and being electrically connected with a terminal of a semiconductor device; a contact terminal deviation member disposed relatively movably in the supporting member, the contact terminal deviation member including a press portion for bringing the movable contact of the contact terminal into or out of close proximity to the terminal of the semiconductor device; and a positioning member supported on the supporting member with the movement in the direction of the movement of the contact terminal deviation member being restricted, the positioning member including an accommodation portion for relatively positioning and accommodating the terminal of the semiconductor device placed on the bottom with respect to the movable contact.

In accordance with the semiconductor device-socket of the present invention, as clarified from the aforementioned description, there is provided the accommodation portion in which the first positioning member is supported on the supporting member with the movement in the direction of the movement of the contact terminal deviation member restricted for positioning the terminal of the mounted semiconductor device relatively with respect to the movable contact of the contact terminal, so that when the semiconductor device is positioned in the accommodation portion, the semiconductor device is positioned without fail in the accommodation portion even during the movement of the contact terminal deviation member. Accordingly, in the course of a series of the mounting operations for the semiconductor device there is eliminated the possibility of undesirable interference of the positioning member and the semiconductor device and is eliminated the possibility of reducing of inspection efficiency.

The above and other objects, effects, features and advantages of the present invention will become more apparent from the following description of embodiments thereof taken in conjunction with the accompanying drawings.

DETAILED DESCRIPTION OF PREFERRED EMBODIMENTS

In what follows, there will be described a first preferred embodiment of a semiconductor device-socket according to the present invention with reference to FIG. 1 together with a semiconductor device to be mounted.

Figure 1:
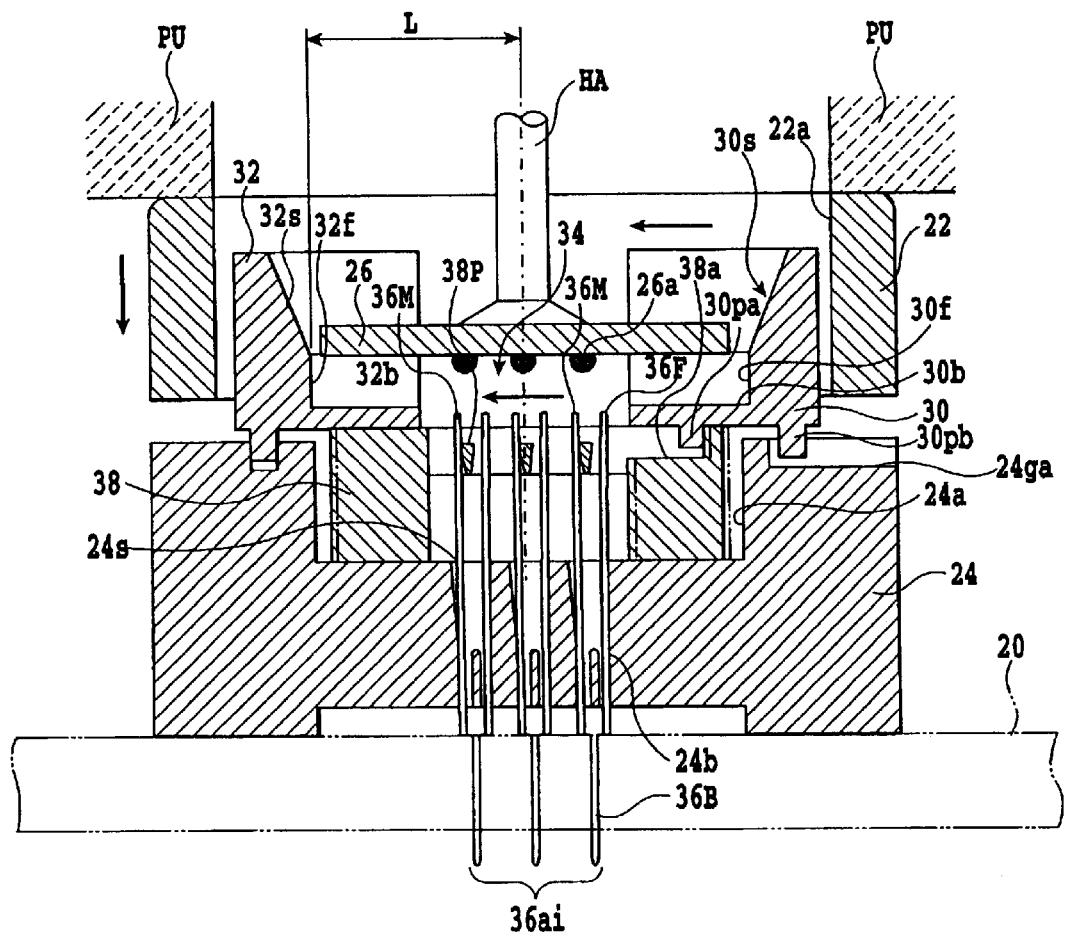
FIG. 1 is a cross sectional view for illustrating the arrangement of a first preferred embodiment of a semiconductor device-socket according to the present invention together with a semiconductor device to be tested.

Referring to FIG. 1, there is illustrated a semiconductor device-socket among a plurality of sockets for semiconductor device fixed longitudinally and laterally on a printed circuit board 20 described later.

Referring further to FIG. 1, the semiconductor device-socket is disposed on the printed circuit board 20 which includes an input/output portion to which predetermined test voltage is supplied for outputting a failure detection signal indicative of short-circuiting from the semiconductor device as an object to be inspected.

The semiconductor device-socket comprises: a socket body 24 fixed onto the printed circuit board 20 for movably accommodating a contact deviation member 38 described later relatively with respect to a pair of movable contacts of the contact terminal 36$ai$; positioning members 30 and 32 for forming in corporation a accommodation portion in which a semiconductor device 26 of a BGA type (Ball Grid Array) for example as the semiconductor device is mounted; a contact deviation member 38 disposed in the socket body 24 in a reciprocating fashion in a predetermined direction for supporting bottoms of the positioning members 30 and 32 and for bringing the one movable contact 36M of a contact terminal 36$ai$ described later into the close vicinity to the other movable contact 36F or separating he former to the latter movable contact; and a frame member 22 for transmitting operation force acted to the contact deviation member 38 as driving force through a driving mechanism (not shown) of the contact deviation member 38.

A group of electrodes are formed at a predetermined position on a printed circuit board 20, which group are electrically connected to an input/output portion of the printed circuit board 20 through a conductor layer. To the group of the electrodes terminals 36B of a plurality of contact terminals 36$ai$ (i=1 to n, n is a positive integer.) are connected on the side of a proximal ends of the same, the contact terminals 36$ai$ being provided on a socket body 24 disposed on the printed circuit board 20.

Figure 3:
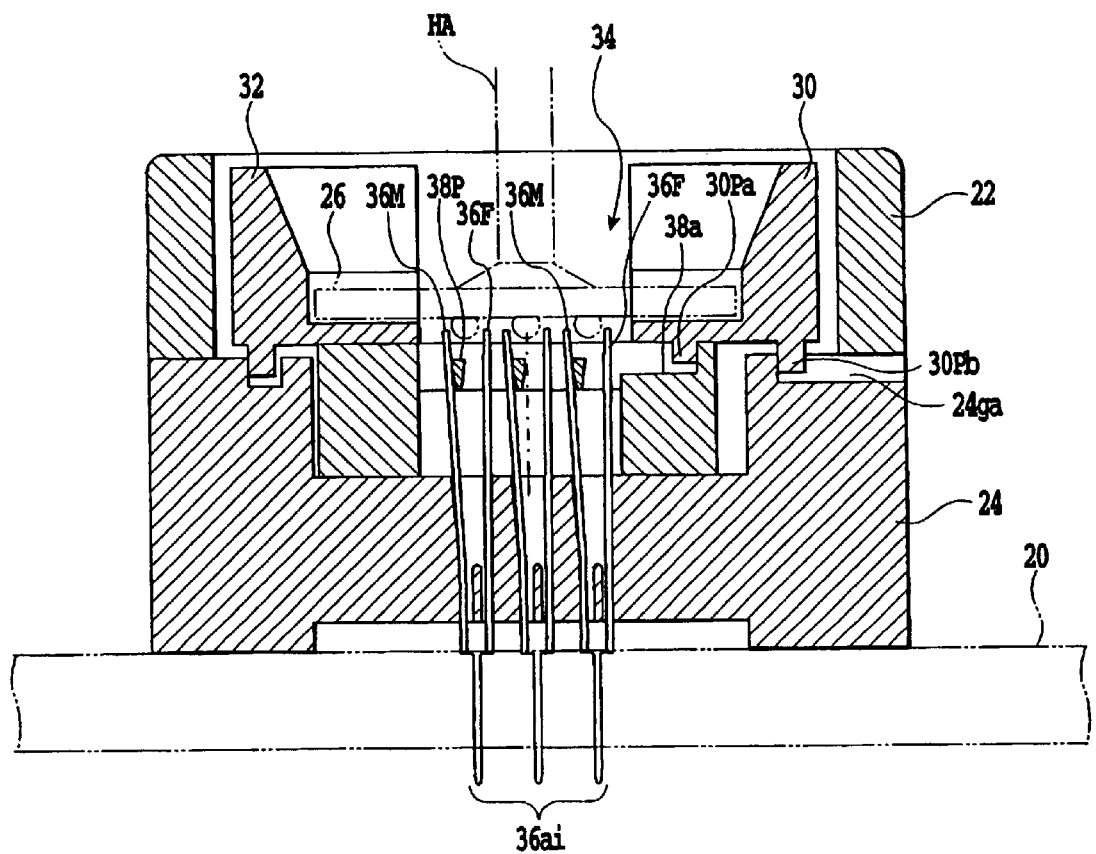
FIG. 3 is a cross sectional view made available for illustrating the operation in the embodiment in FIG. 1.

The socket body 24 includes thereinside a accommodation portion 24$a$, from which movable contacts 36M and 36F of the plurality of the contact terminals 36$ai$ are protruded. In a bottom of the accommodation portion 24$a$ there are provided a plurality of through-holes 24$b$ into each of which through-holes the proximal end of each contact terminal 36$ai$ is inserted with pressure. Each through-hole 24$b$ is provided corresponding to an electrode 26$a$ of a mounted semiconductor device 26. A slope 24$s$ is formed on the accommodation portion 24$a$ on the side of the bottom of the same on a wall surface that forms each through-hole 24$b$. The slope 24$s$ is inclined right downward so as to guide the one movable contact 36M of the contact terminal 36$ai$ as described later and as indicated in FIG. 3.

Each contact terminal 36$ai$ comprises: a terminal 36B on the side of the proximal end of the socket body 24 corresponding to each electrode portion 26$a$ of the mounted semiconductor device 26, and a pair of the movable contacts 36F and 36M for selectively holding each electrode portion 26$a$ of the semiconductor device 26 coupled to the foregoing terminal 36B. The pair of the movable contacts 36F and 36M are brought into to the close vicinity with each other as a contact deviation member 38 is moved to hold each electrode portion 26$a$ of the semiconductor device 26 or brought into separation from each other to release each electrode portion 26$a$ of the semiconductor device 26.

The contact deviation member 38 is disposed movably in the direction of the motion of the movable contacts 36M and 36F of each contact terminal 36$ai$ in the accommodation portion 24$a$ of the socket body 24. The contact deviation member 38 includes an opening through which the movable contacts 36M and 36F of each contact terminal 36$ai$ are protruded. The openings in the adjacent contact terminals 36$ai$ are divided with a partition wall (not shown).

A partition wall 38P is provided between the openings through which the movable contacts 26M and 26F of each contact terminal 26$ai$ in the contact deviation member 38 are protruded as the movable contact press portion formed to divide a space between the movable contact 16M and the movable contact 16F.

Figure 4:
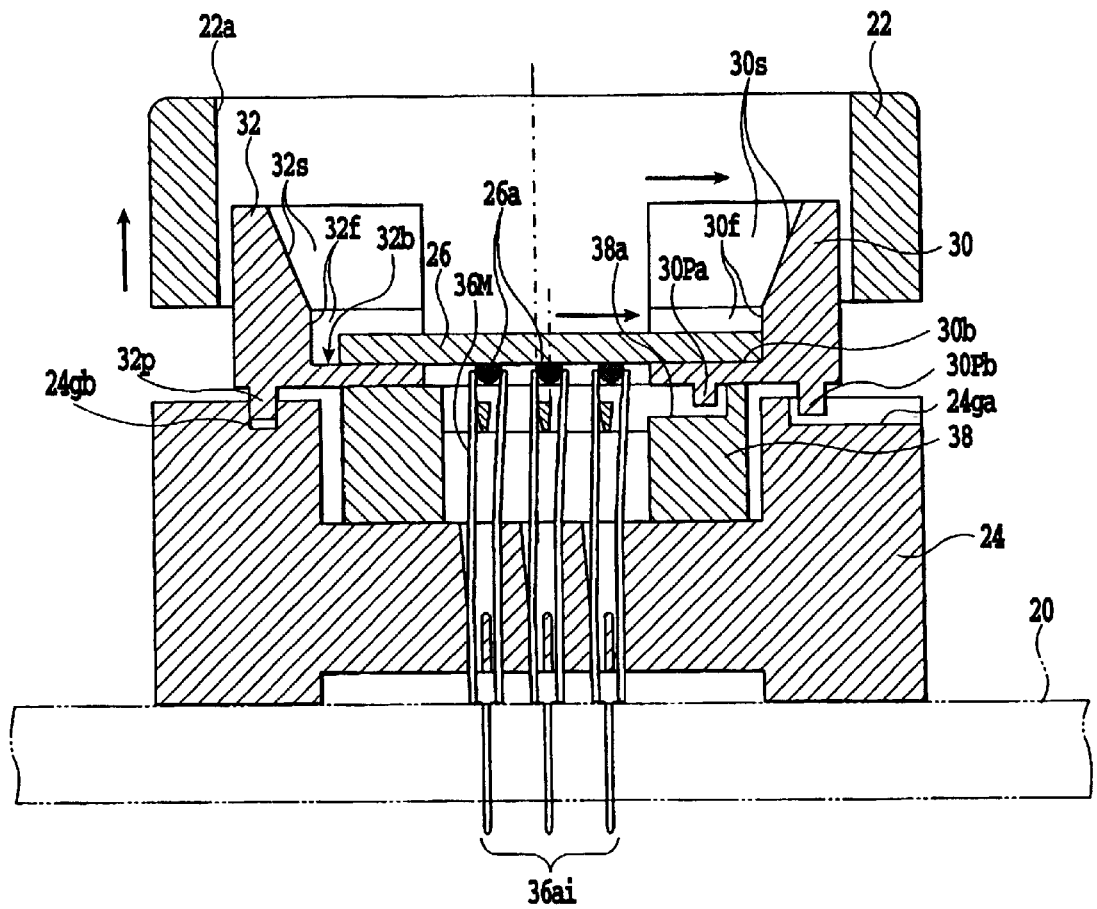
FIG. 4 is a cross sectional view made available for illustrating the operation in the embodiment in FIG. 1.

There is further provided an energizing member(not shown) between one end of the contact deviation member 38 and an internal periphery of the accommodation portion 24$a$ of the socket body 24 for energizing the contact deviation member 38 in a state illustrated in FIG. 3 to return it to an initial position illustrated in FIG. 4.

Referring now to FIG. 1, there is provided a recessed portion 38$a$ in an upper portion on which a bottom of the positioning member 30 in the contact deviation member 38 is placed, which recessed portion is engaged with a protrusion of the positioning member 30 when the contact deviation member 38 is moved in one direction.

Referring further to FIGS. 1 and 3, the contact deviation member 38 disposed between the bottoms of the positioning members 30 and 32 and a bottom surface of the accommodation portion 24$a$ is made slidable relatively in a predetermined range with respect to the bottoms of the positioning members 30 and 32 and to the positioning members 30 and 32, and moved followed by the positioning member 30.

Figure 2:
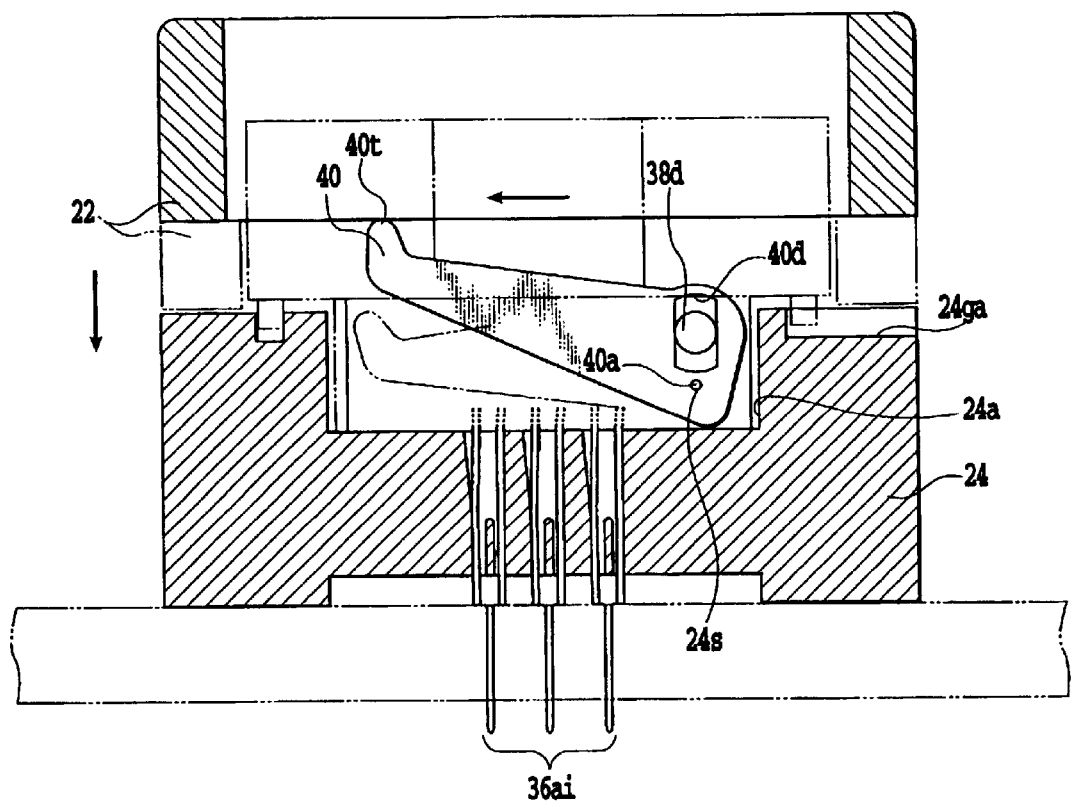
FIG. 2 is a cross sectional view for illustrating the arrangement of a portion of a driving mechanism of a contact deviation member in the embodiment in FIG. 1.

Further, as illustrated in FIG. 2, a pair of engagement pins 38$d$ provided on an outer periphery of the contact deviation member 38 are coupled respectively with an elongated hole 40$d$ in a lever member 40 of a driving mechanism that drives the contact deviation member 38 to move in response to elevation of a frame member 22. The engagement pin 38$d$ is provided on the side of the one end of the contact deviation member 38 for example.

A proximal end of each lever member 40 of the foregoing driving mechanism includes a transparent hole 40$a$ which is engaged rotatably with the support shaft 24$s$ provided on the inner periphery of the accommodation portion 24$a$ of the socket body 24.

A tip end 40$t$ of each lever member 40 is in contact with a lower end surface of the frame member 22 at all times.

Hereby, the tip end 40$t$ of each lever ember 40 is rotated counterclockwise as indicated by a chain double-dashed line in FIG. 2 in response to the descending operation of the frame member 22 in the direction indicated by an arrow in FIG. 2. Accordingly, the contact deviation member 38 is moved against the energizing force of the energizing means in the direction indicated by the arrow in FIG. 2.

In this situation, as illustrated in FIG. 3, each partition wall 38P of the contact deviation member 38 is moved such that the movable contact 36M of each contact terminal 36$ai$ is separated from the movable contact 36F.

Referring to FIG. 4, the contact deviation member 38 is moved in response to the raising operation of the frame member 22 oppositely to the aforementioned direction owing to the energizing force of the energizing means and with the restoring force of the movable contact 36M.

The positioning members 30 and 32, that are respectively the so-called two(2) piece positioning member, form the accommodation portion 34 at the center thereof in corporation with each other as illustrated in FIG. 1.

The inner peripheral surface of the positioning member 30 is opened frontally and upwardly and is formed with a flat surface 30f in contact with an end surface of one side of the square semiconductor device 26 and opposite side surfaces of the same continuously disposed with the former end surface, and the slope 30s that combines an upper end surface of the semiconductor device 26 and the flat surface 30f, and a bottom surface 30b intersecting the flat surface 30f.

A mutual distance between the opposite flat surfaces of the positioning member 30 is set larger than the length of the one side of the mounted semiconductor device 26 with a predetermined tolerance.

At a portion of the bottom of the positioning member 30 opposing to the contact deviation member 38 a protrusion 30pa is formed, which protrusion is engaged with a peripheral edge of a recessed portion 38a of the contact deviation member 38. Further, on opposite ends of the socket body 24 in the bottom of the positioning member 30 there is formed a protrusion 30pb which is guided by a groove 24ga in the socket body 24 and is restricted in its position.

In contrast, an inner peripheral surface of the positioning member 32 is opened frontally and upwardly, and is formed with a flat surface 32f in contact with an end surface of the other side of the square semiconductor device 26 and opposite side surfaces located continuously with the end surface of the other side, and a slope 32s that combines an upper end surface of the upper end surface of the positioning member and the flat surface 32f of the same, and further a bottom surface 32b intersecting the flat surface 32f.

A mutual distance between the flat surfaces 32f of the positioning member 32 is set larger than the length of one side of the mounted semiconductor device 26 with a predetermined tolerance.

Referring then to FIG. 4, there is formed a protrusion 32p on an opposite end of the bottom of the positioning member 32 which is engaged with a groove 24gb in the socket body 24 for restriction in the position thereof.

The position restriction is not in need of complete fixation, but may possess some backlash. Namely, it may be adapted such that the positioning member 32 is prevented from interfering the semiconductor device 26 before the completion of the mounting of the semiconductor device 26. Further, the positioning member 32 may be formed at the aforementioned predetermined position integrally with the socket body 24.

In this situation, as illustrated in FIGS. 1 and 3, in a region extending from a starting position of descending of the frame member 22 to a lowermost end position distance L between the flat surface 32f of the positioning member 32 and a movement trace of an axis center of a hand HA of a conveyance robot is set at all times such that the semiconductor device 26 is mounted with a predetermined gap with respect to the flat surface 32f.

The frame member 2 has an opening 22a thereinside such that it surrounds outer peripheries of the positioning members 30 and 32. The frame member 22 includes a pawl which is engaged movably by a predetermined distance with a guide groove (not shown) formed in the outer periphery of the socket 24. The frame member 22 is hereby supported on the socket body 24 elevatably. Further, a coiled spring member (not shown) is provided between the frame member 22 and the socket body 24 for energizing the frame member 22 upward.

In such an arrangement, referring again to FIG. 1, when the semiconductor device 26 is held with a hand HA of the conveyance robot, and is in a state just before it is accommodated in the accommodation portion 34 formed with the positioning members 30 and 32, the semiconductor device 26 is held on the tip end of the hand HA of the conveyance robot such that the axis center of the hand HA of the conveyance robot and the center of the semiconductor device 26 are coincident with each other.

Thereupon, as indicated by a chain double-dashed line in FIG. 1, the protrusion 30pa of the positioning member 30 and a peripheral edge of the recessed portion 38a of the contact deviation member 38 are not engaged with each other. Further, the protrusion 30pb of the positioning member 30 and a closed end of the guide groove 24ga are adapted to be in a disengagement state.

In succession, when the held semiconductor device 26 is mounted in the accommodation portion 34, the frame member 22 is first lowered to a lowest end position illustrated in FIG. 3 against the energizing force of the coiled spring with a press portion PU of the conveyance robot.

Hereby, the contact deviation member 38 is moved against the energizing force of the energizing means from a state thereof illustrated in FIG. 1 to that illustrated in FIG. 3. Thereupon, the protrusion 30pa of the positioning member 30 and the peripheral edge of the recessed portion 38a of the contact deviation member 38 are brought into an engagement state, and the positioning member 30 is moved toward the positioning member 32 until the protrusion 30pb is brought into a collision with the closed end of the groove 24ga. The partition wall 38P is thus moved such that the movable contact 36M of each contact terminal 36ai is separated from the movable contact 36F.

Subsequently, in the state of the partition wall 38P where the movable contact 36M of each contact terminal 36ai is separated from the movable contact 36F, the semiconductor device 26 is placed in the accommodation portion 34 formed with the positioning members 30 and 34, and the outer periphery is restricted in its position whereby the electrode portion 26a of the semiconductor device 26 is positioned between the movable contact 36M of each contact terminal 36ai and the movable contact 36F of the same.

Since in this situation the positioning member 30 is brought into close vicinity by a predetermined distance to the positioning member 32, a gap between the inner peripheral surface of the accommodation portion 34 and the outer peripheral surface of the semiconductor device 26 is reduced. Further, the position of the center of the formed accommodation portion 34 is brought into coincidence with the axis center of the hand HA of the conveyance robot.

Successively, the semiconductor device 26 is demounted from the hand HA of the conveyance robot.

The predetermined gap is therefore formed at all times between the flat surface 30f of the positioning member 30 and the outer periphery of the semiconductor device 26, so that interference between the positioning member 30 and the outer periphery of the semiconductor device 26 is securely avoided.

When the frame member 22 is raised in the situation where each electrode 26a of the semiconductor device 26 is disposed between the movable contacts 36m and 36f of each contact terminal 36ai as illustrated in FIG. 4, the contact deviation member 38 is moved up to the initial position owing to the energizing force of the energizing means and the restoring force of the movable contact 36M, whereby a volume of the accommodation portion 34 is increased and simultaneously the partition wall 38P is separated from the movable contact 36M and makes contact with the movable contact 36F. It is noticed that FIG. 4 illustrates the contact deviation member 38 just after it is moved in the direction indicated by an arrow in the same figure.

Referring therefore to FIG. 4, each electrode 26a of the semiconductor device 26 is held with the movable contact 36M of each contact terminal 36ai and the movable contact 36F of the same, whereby each electrode 26a of the semiconductor device 26 gets an electrically connected state with each contact terminal 36ai. In that case, one end of the outer periphery of the semiconductor device 26 makes contact with the flat surface portion 30f of the positioning member 30, and the protrusion 30pa of the positioning member 30 and the peripheral edge of the recessed portion 38a of the contact deviation member 38 are brought into a disengagement state.

When after a predetermined test is finished, the semiconductor device 26 after tested is removed from the accommodation portion 34 and a semiconductor device 26 is mounted anew in the accommodation portion 34, the elevation of the frame member 22 described above is again performed, and simultaneously the semiconductor device 26 after tested is held and removed with the hand HA of the conveyance robot.

In the following, there will be described a second preferred embodiment of a semiconductor device-socket according to the present invention with reference to FIG. 5 together with a semiconductor device to be mounted. It is here noticed that in the example illustrated in FIG. 5 and embodiments described later same symbols will be applied to those of the same constituent components as those in the embodiment illustrated in FIG. 1, and overlapped description will be omitted below.

Figure 5:
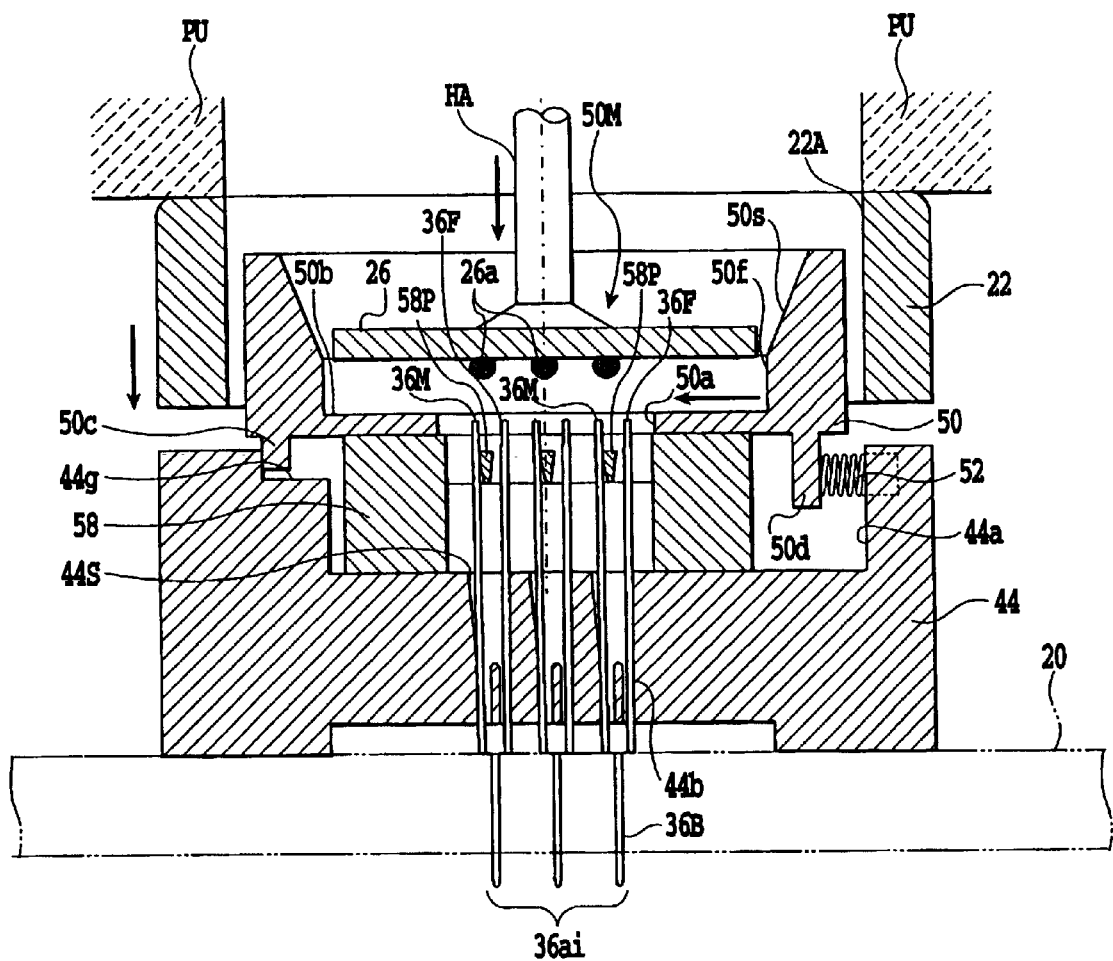
FIG. 5 is a cross sectional view for illustrating the arrangement of a second preferred embodiment of a semiconductor device-socket according to the present invention.
Figure 6:
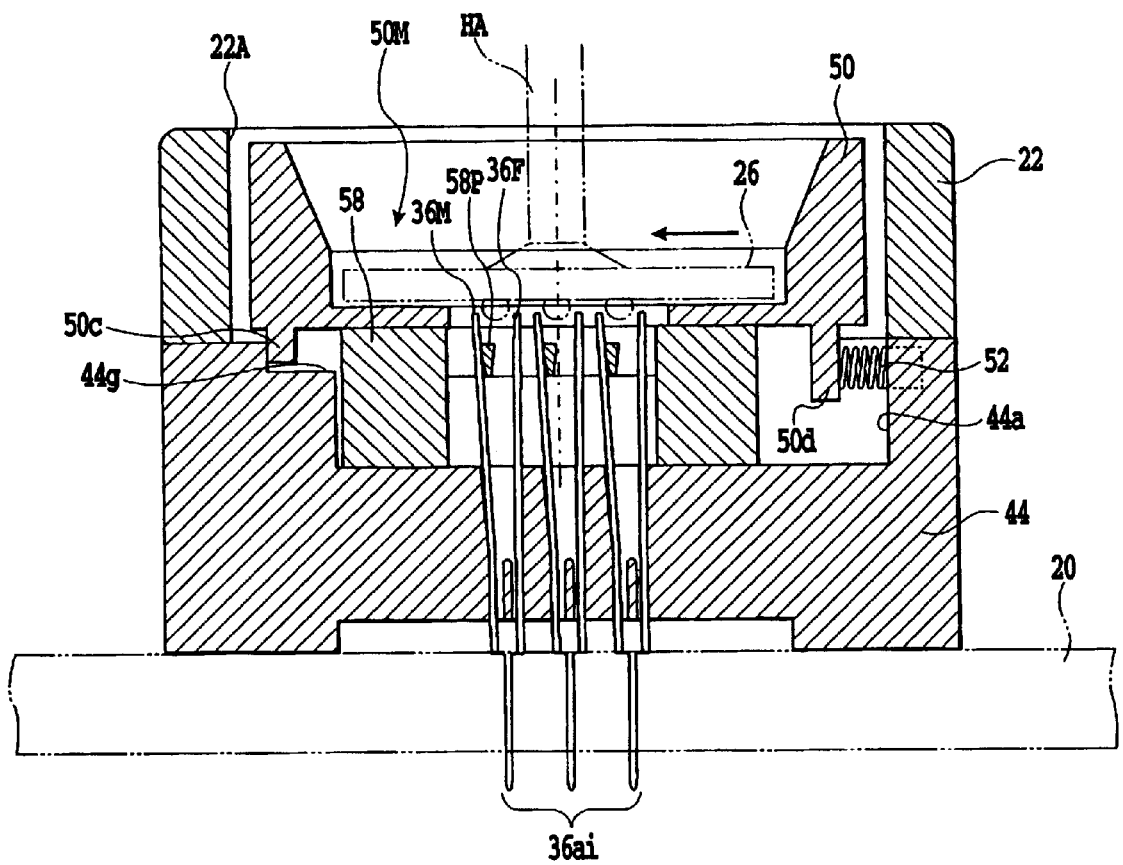
FIG. 6 is a cross sectional view made available for illustrating the operation in the second embodiment in FIG. 1.

Referring to FIG. 5, a socket body 44 includes thereinside a accommodation portion 44a from which movable contacts 36M of a plurality of contact terminals 36ai and movable contacts 36F of the same are protruded. A plurality of through-holes 44b are provided in the bottom of the accommodation portion 44a, through which a proximal end of each contact terminal 36ai is inserted with pressure. A slope 44s is formed on an inner periphery of each through-hole 44b on the side of the bottom of the accommodation portion 44a. Referring to FIG. 6 described later, the slope 44s is inclined right downward to guide the one movable contact 36M of the contact terminal 36ai. Each through-hole 44b is provided corresponding to the electrode 26a of the semiconductor device 26.

A contact deviation member 58 is disposed in the accommodation portion 44a in the direction of movements of the movable contact 36M of each contact terminal 36ai and the movable contact 36F of the same. The contact deviation member 58 includes an opening through which the movable contacts 36M and contact deviation member 36F of each contact terminal 36ai are protruded. Each adjacent opening corresponding to the adjacent contact terminal 36ai is defined with a partition wall (not shown). There is provided a partition wall 58P as the movable contact press portion formed to define a space between the movable contact 36M and the movable contact 36F between the openings through which the movable contact 36M of each contact terminal 36ai and the movable contact 36F of the same of the contact deviation member 58 are protruded. Further, there is provided an energizing member (not shown) between the one end of the contact deviation member 58 for returning the contact deviation member 58 in the state illustrated in FIG. 6 to the initial position illustrated in FIG. 5.

Accordingly, the contact deviation member 58 disposed between a bottom of a positioning member 50 described later and a bottom surface of a accommodation portion 44a is made relatively slidable within a predetermined range with respect to the positioning member 50 as illustrated in FIGS. 5 and 6.

Further, an outer periphery of the contact deviation member 58 is coupled with a driving mechanism for driving the contact deviation member 58 in response to the elevation movement of the frame member 22, as described in the embodiment 1.

A tip end of each lever member in the driving mechanism makes contact with a lower end surface of the frame member 22.

Hereby, the tip end of each lever member is rotated in a predetermined direction in response to the lowering operation of the frame member 22 in the direction indicated by an arrow illustrate in FIG. 5. The contact deviation member 58 is therefore moved against the energizing force of the energizing means in the direction indicated by an arrow in FIG. 6.

Thereupon. Referring to FIG. 6, each partition wall 58P of the contact deviation member 58 is moved such that the movable contact 36M of each contact terminal 36ai is separated from the movable contact 36F.

Figure 7:
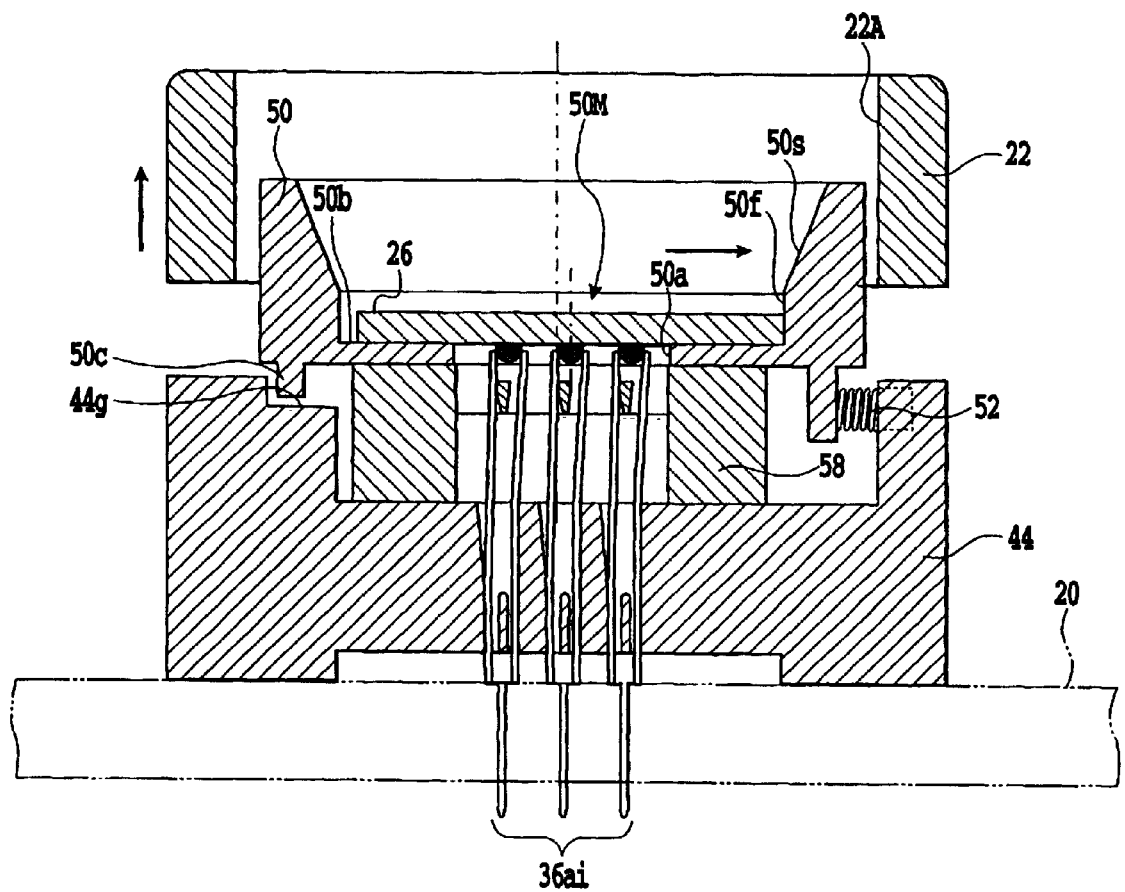
FIG. 7 is a cross sectional view made available for illustrating the operation of the second embodiment illustrated in FIG. 5.

In contrast, referring to FIG. 7, the contact deviation member 58 is moved owing to the energizing force of the energizing means and the restoring force of the movable contact 36M in the direction indicated by an arrow in the figure in response to the raising operation of the frame 22.

An opening 50a is formed at the center of the bottom of the positioning member 50.

A protrusion 50d is provided oppositely to the protrusion 50c in a bottom of the positioning member 50. A coiled spring 52 for example, that is a resilient member, is provided as the energizing means between the protrusion 50db and the inner periphery of the socket body 44.

The coiled spring 52 is adapted to be energized such that the protrusion 50c of the positioning member 50 is engaged in contact with the peripheral edge of the recessed portion 44g.

Although in the present embodiment the coiled spring 52 is useable as the energizing member, the present invention is not limited thereto, and hence the energizing member may be another resilient member such as a rubber material, and the positioning member may be provided on the socket body in a united manner.

Referring to FIG. 5, The protrusion 50c is set such that at the initial position the center position of the accommodation portion of the positioning member 50 and a movement trace of the central axis line of the hand of the conveyance robot are coincident with each other.

An inner peripheral surface forming the accommodation portion 50M of the positioning member 50 is formed, surrounded by a flat surface 50f which is opened upwardly and which is in contact with an end surface of one side in a square semiconductor device 26 and with opposite side surfaces communicated with the former, a slope 50s for coupling an upper end surface of the semiconductor device and a flat surface 30f of the same, and a bottom surface 50b intersecting the flat surface 50f. A mutual distance of the flat surfaces 50f is set to be larger than the length of the one side of the semiconductor device 26.

When in such a structure the semiconductor device 26 is held by the hand HA of the conveyance robot and is in a state just before it is accommodated in the accommodation portion 50M of the positioning member 50, the semiconductor device 26 is held on the tip end of the hand HA of the conveyance robot such that an axial core of the hand HA of the conveyance robot and the center of the semiconductor device 26 are coincident with each other.

In succession, when the held semiconductor device 26 is mounted in the accommodation portion 50M, the frame member 22 is first lowered up to the lowest end position illustrated in FIG. 6 against the energizing force of the coiled spring with the aid of the press portion PU of the conveyance robot. Although the movement of the contact deviation member 58 is started in the above situation, the contact deviation member 58 is maintained such that the protrusion 50c of the positioning member 50 and the peripheral edge of the recessed portion 44g of the socket body 44 are engaged with each other.

The contact deviation member 58 is hereby moved from a state illustrated in FIG. 5 to that illustrated in FIG. 6 against the energizing force of the energizing means. Accordingly, the partition wall 58P is moved such that the movable contact 36M of each contact terminal 36ai is separated from the movable contact 36F.

Successively, in the state of the partition wall 58P where as indicated by a chain double-dashed line illustrated in FIG. 6 the movable contact 36M of each contact terminal 36ai is separated from the movable contact 36F and is held, the semiconductor device 26 is placed on the bottom of the accommodation portion 50M of the positioning member 50 with is outer periphery restricted in its position, whereby the electrode 26a of the semiconductor device 26 is positioned between the movable contact 36M of each contact terminal 36ai and the movable contact 36F.

Since in this situation, the center position of the accommodation portion 50M is coincident with the axial center of the hand HA of the conveyance robot, there is no possibility that the outer periphery of the semiconductor device 26 interferes with the inner periphery of the accommodation portion 50M of the positioning member 50.

Subsequently, the semiconductor device 26 is demounted from the hand HA of the conveyance robot.

When the frame member 22 is raised as illustrated in FIG. 7 in the state where each electrode 26a of the semiconductor device 26 is disposed between the movable contacts 36M and 36F of each contact terminal 36ai, the contact deviation member 58 is moved to the initial position wit the aid of the energizing force of the energizing means and the restoring force of the movable contact 36M to cause the partition wall 58P to separate from the movable contact 36M and make contact with the movable contact 36F. FIG. 7 illustrates a situation just after the contact deviation member 58 moves in the direction indicated by an arrow in the state where the partition wall 58P does not make contact with the movable contact 36F.

Referring therefore to FIG. 7, each electrode 26a of the semiconductor device 26 is electrically connected with each contact terminal 36ai by holding each electrode 26a of the semiconductor device 26 with the movable contacts 36M and 36F of each contact terminal 36ai. Thereupon, the protrusion 50c of the positioning member 50 is made disengageable with the peripheral edge of the recessed portion 44g of the socket body 44 by making one end of the outer periphery of the semiconductor device 26 contact with the flat surface 50f of the positioning member 50 with the aid of the restoring force of the movable contact 36M and with the aid of the restoring force of the movable contact 36M.

When after a predetermined test is finished, the semiconductor device 26 undergoing such a test is demounted from the accommodation portion 50M, and a new semiconductor device 26 is mounted in the accommodation portion 50M, the elevation of the frame member 22 is again performed, and the semiconductor device 26 after undergoing the test is held with the hand HA of the conveyance robot and is demounted.

Figure 8:
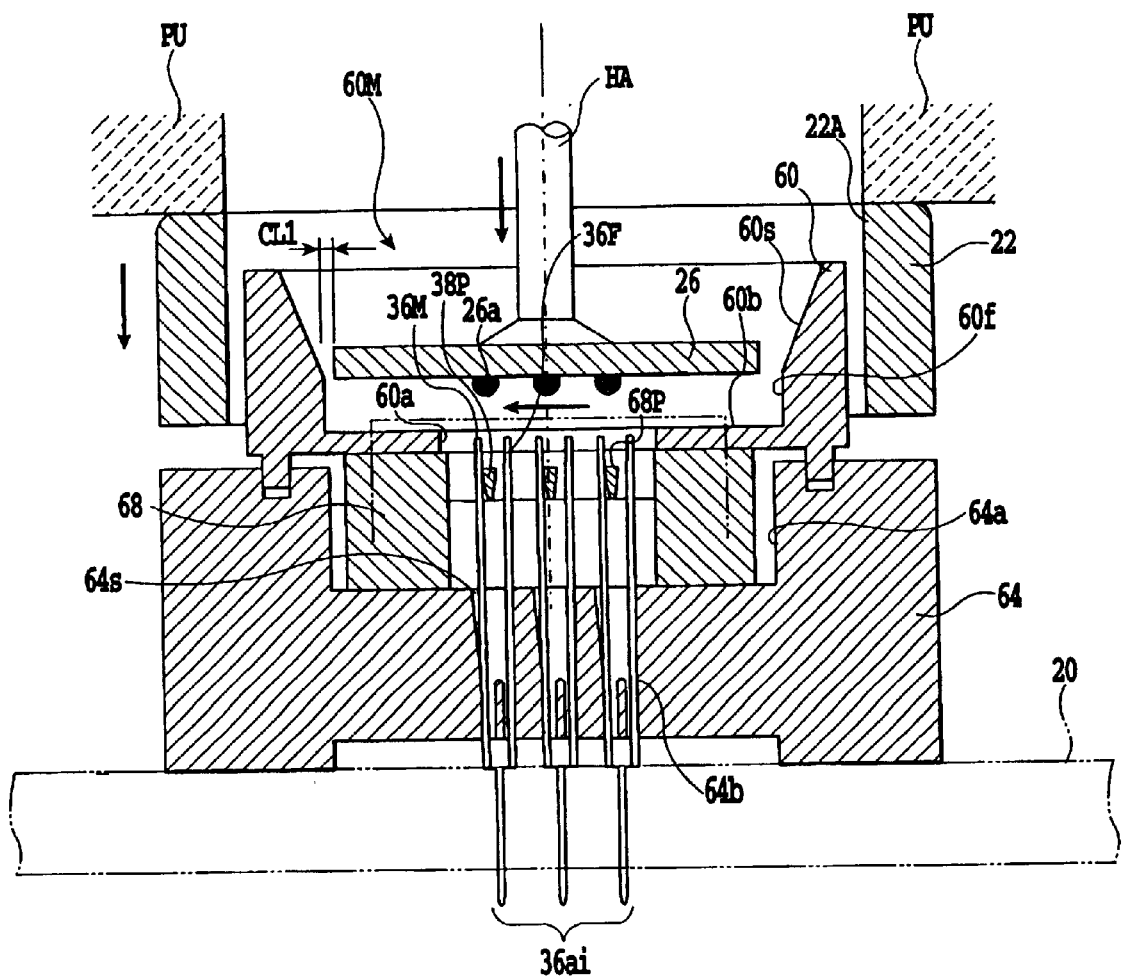
FIG. 8 is a cross sectional view for illustrating a third preferred embodiment of a semiconductor device-socket according to the present invention together with a semiconductor device to be tested.

Referring now to FIG. 8, a third preferred embodiment of the semiconductor device-socket according to the present invention is illustrated together with a semiconductor device to be mounted will be described.

A socket body 64 includes thereinside a accommodation portion 64a from which the movable contacts 36M and 36F of a plurality of the contact terminals 36ai are protruded. A plurality of through-holes 64b are provided in the bottom of the accommodation portion 64a, through which the proximal end of each contact terminal 36ai is inserted with pressure. A slope 64s is formed on the bottom side of the accommodation portion 64a on the wall surface where each through-hole 64b is formed. The slope 64s is inclined right downward to guide and restrict the one movable contact 36M of the contact terminal 36ai. Each through-hole 64b is provided corresponding to the electrode 26a of the mounted semiconductor device 26.

The contact deviation member 68 is disposed movably in the accommodation portion 64a of the socket body 64 in the direction of the movement of the movable contacts 36M and 36F of each contact terminal 36ai. The contact deviation member 68 includes an opening through which the movable contacts 36M and 36F of each contact deviation member 68 are protruded. The respective openings corresponding to the adjacent contact terminals 36ai are defined with a partition wall (not shown).

A partition wall 68p is provided between the openings through which the movable contacts 36M and 36F of each contact terminal 36ai of the contact deviation member 68 are protruded as a movable contact press portion formed to define a space between the movable contacts 36M and 36F. Further, an energizing member is provided between the one end of the contact deviation member 68 and the inner periphery of the accommodation portion 64a of the socket body 64 for energizing the contact deviation member 68 in a state illustrated in FIG. 9 to return the same to the initial position illustrated in FIG. 8.

Figure 9:
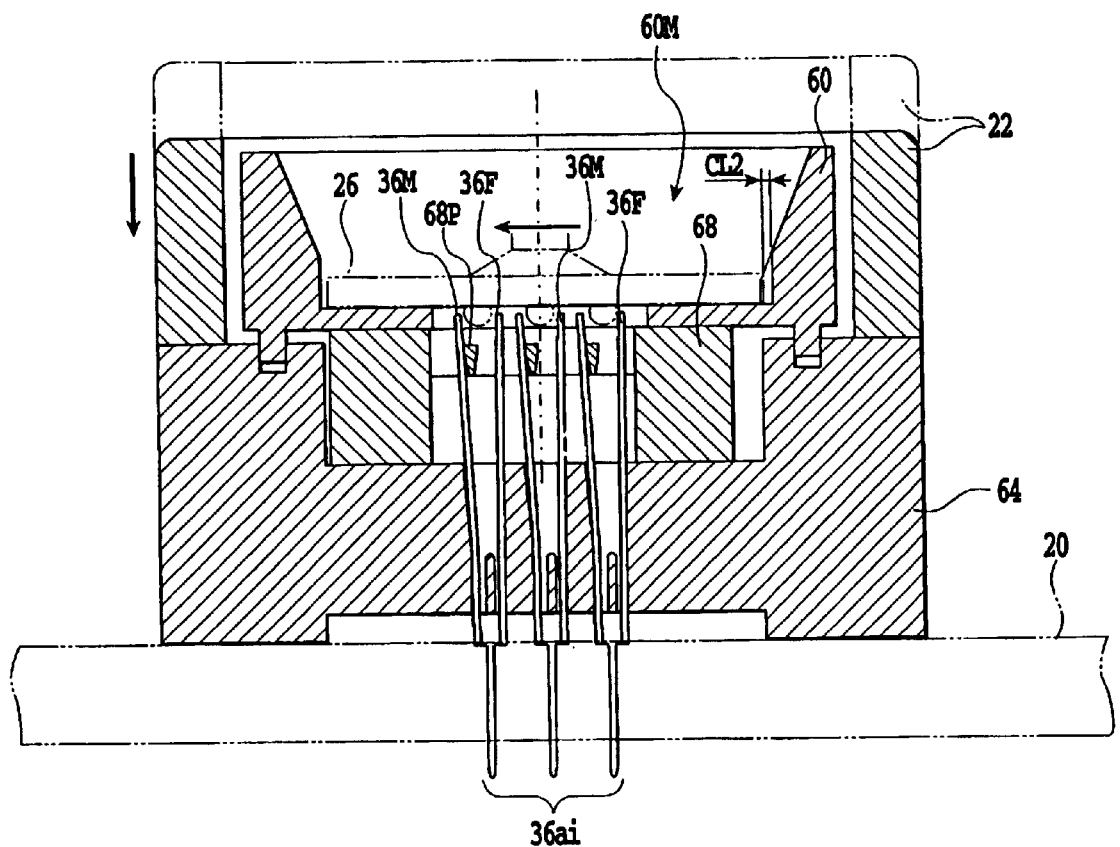
FIG. 9 is a cross sectional view made available for illustrating the operation of the third embodiment illustrated in FIG. 8.

Referring to FIGS. 8 and 9, the contact deviation member 68 disposed between the bottom of the positioning member 60 described later and the bottom surface of the accommodation portion 64a is adapted to be slidable in a predetermined region relatively with respect to the positioning member 60.

Further, to the outer periphery of the contact deviation member 68 there is coupled a driving mechanism for moving the contact deviation member 68 in response to the elevation of the frame member 22 as described in the embodiment 1.

The tip end of each lever member in the driving mechanism is in contact with a lower surface of the frame member 22 at all times.

The tip end of each lever member is rotated in a predetermined direction in response to lowering operation of the frame member 22 in the direction indicated by an arrow in FIG. 8. The contact deviation member 68 is therefore moved against the energizing force of the energizing means in the direction indicated by the arrow in FIG. 8.

Referring here to FIG. 9, each partition wall 68P of the contact deviation member 68 is moved in this situation such that the movable contact 36M of each contact terminal 36ai is separated from the movable contact 36F.

Figure 10:
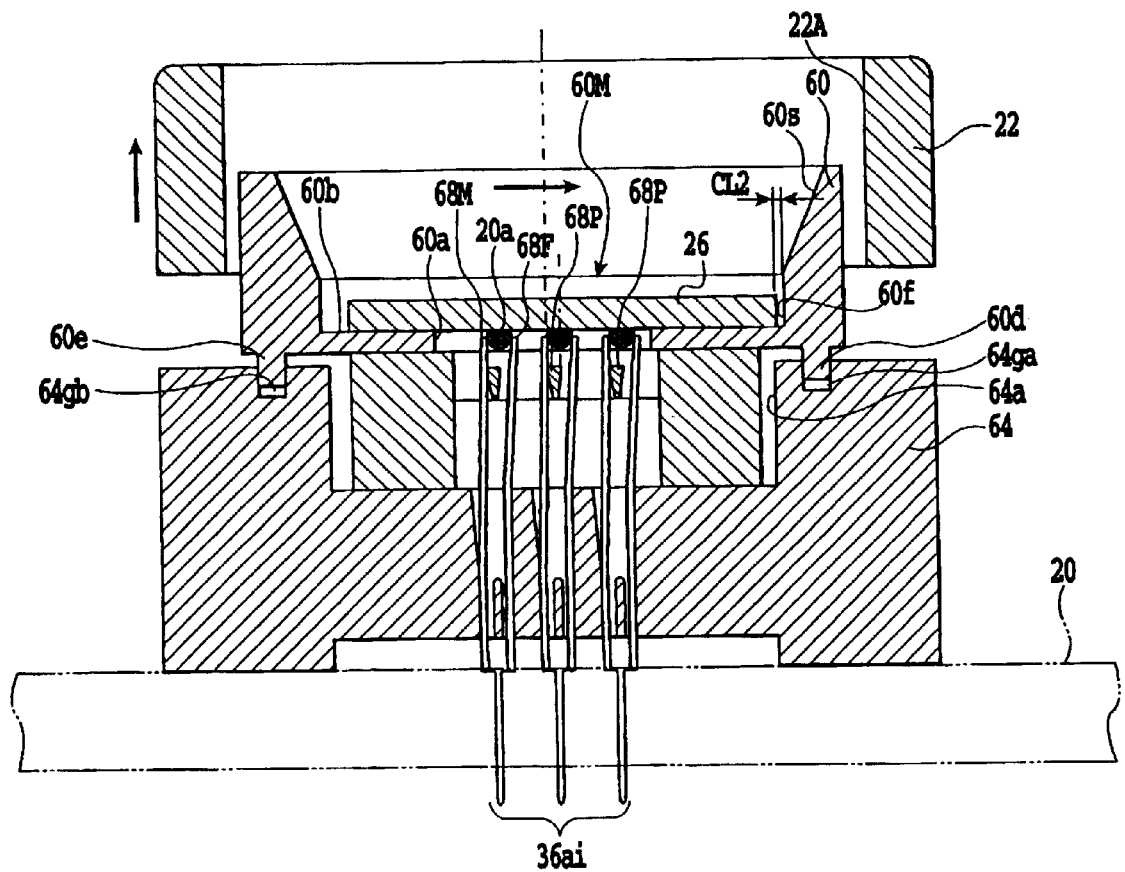
FIG. 10 is a cross sectional view made available for illustrating the operation of the third embodiment illustrated in FIG. 8.
Figure 11:
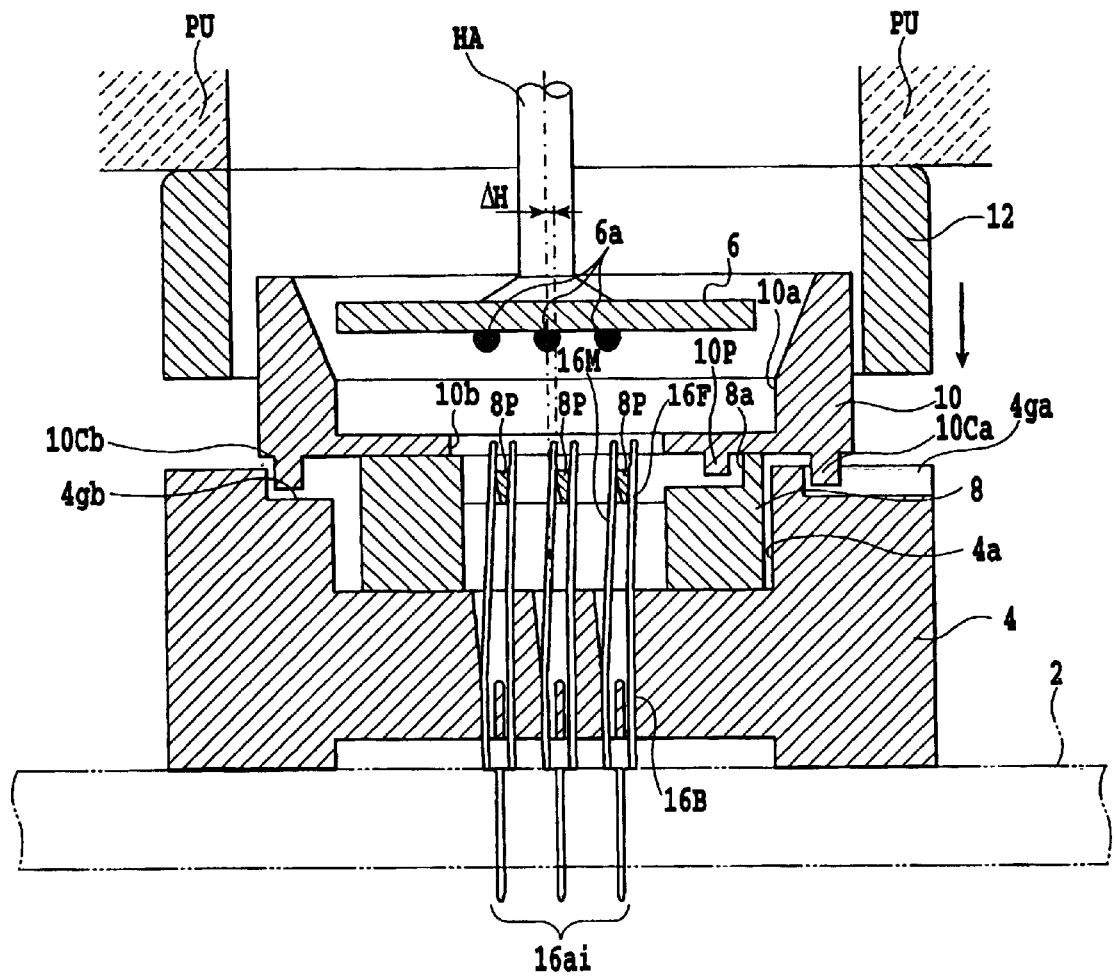
FIG. 11 is a cross sectional view for illustrating the arrangement of a prior art apparatus.
Figure 12:
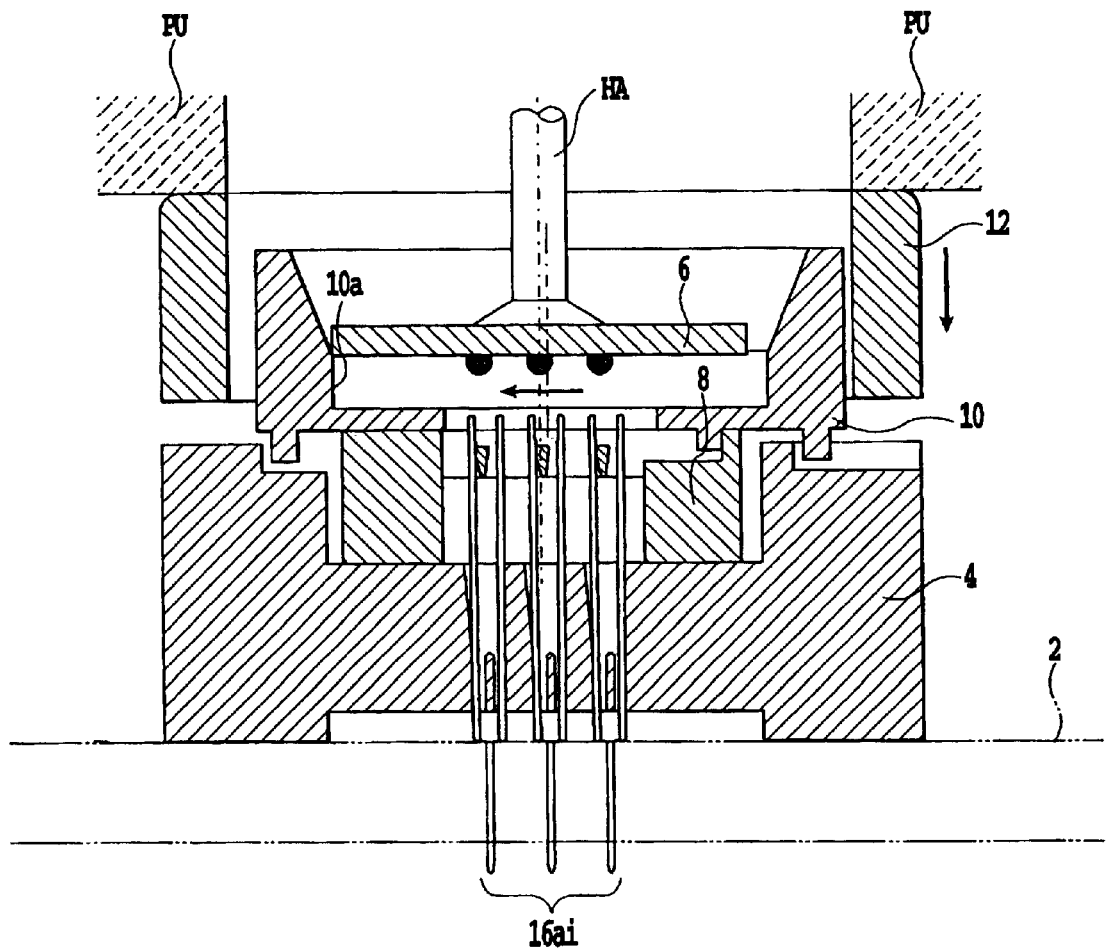
FIG. 12 is a cross sectional view made available for illustrating the operation of the apparatus illustrated in FIG. 11.
Figure 13:
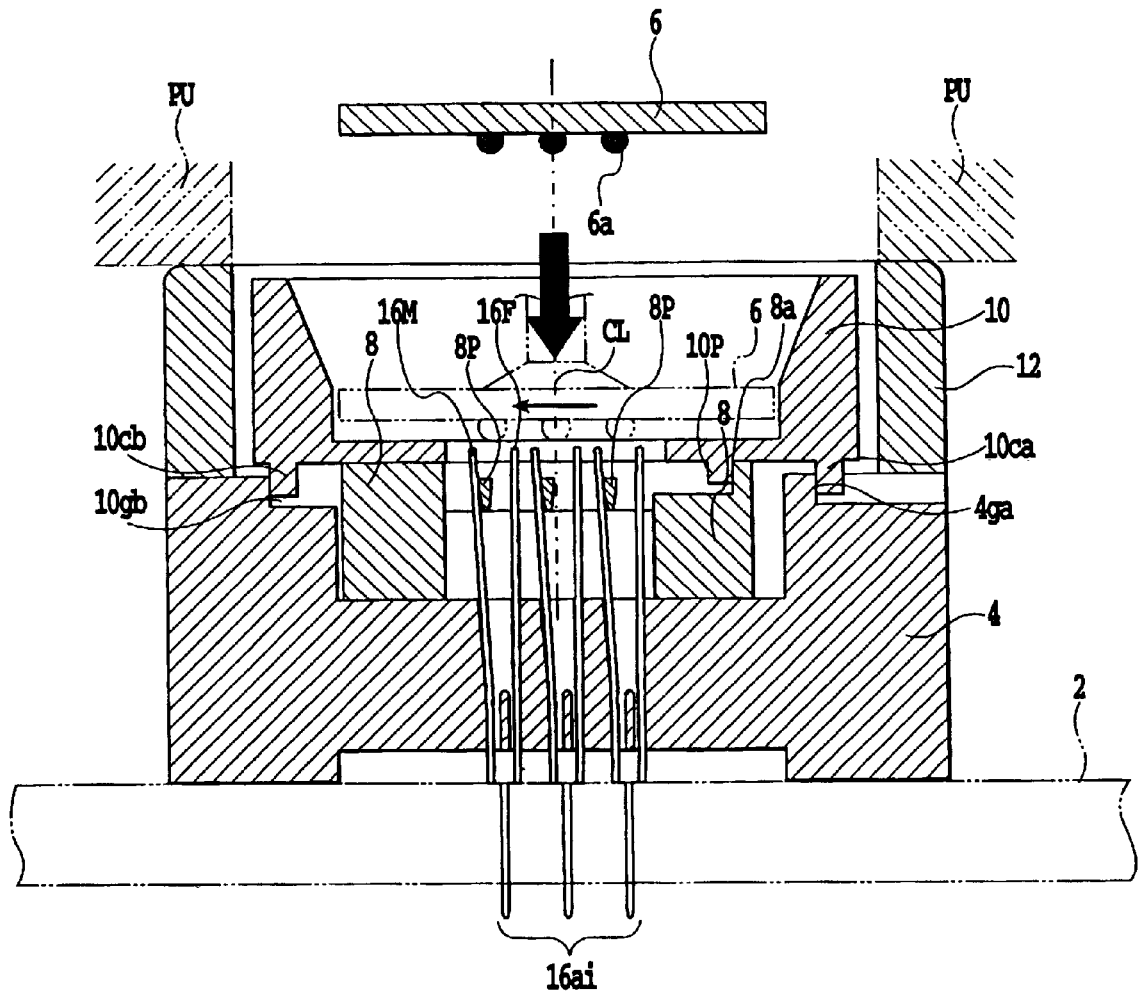
FIG. 13 is a cross sectional view made available for illustrating the operation of the apparatus illustrated in FIG. 11.
Figure 14:
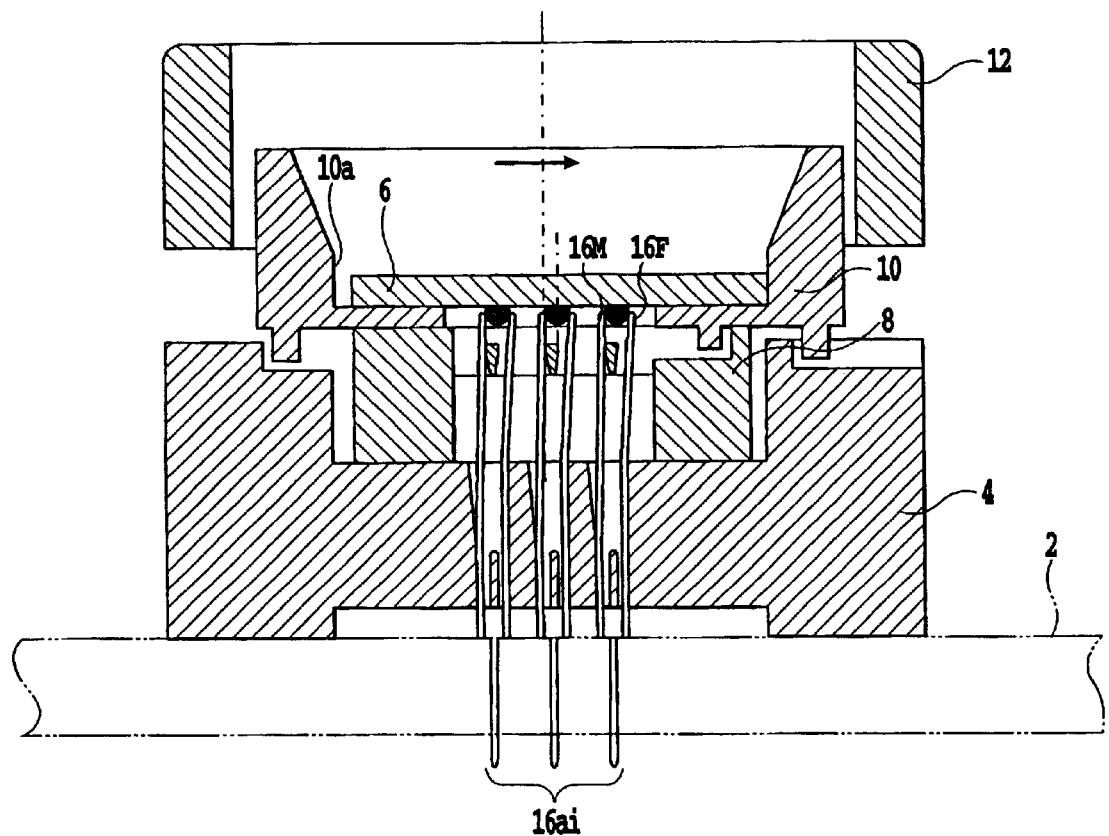
FIG. 14 is a cross sectional view made available for illustrating the operation of the apparatus illustrated in FIG. 11.

In contrast, referring to FIG. 10, the contact deviation member 68 is moved owing to the energizing force of the energizing means and the restoring force of the movable contact 36M in the direction indicated by an arrow in response to the elevation of the frame member 22.

An opening 60a is formed in the bottom of the positioning member 60 at the center of the same.

A protrusion 60d is provided on the one side of the bottom of the positioning member 60, which is engaged with a recessed portion 64ga formed in the upper end of the socket body 64. Further, a protrusion 60e is provided in the bottom of the positioning member 60 in opposition to the protrusion 60d.

Relative positions of the protrusions 60d and 60e with respect to the socket body 64 are set such that the center position of the accommodation portion 60M of the positioning member 60 and the movement trace of the center axial line of the hand of the conveyance robot are coincident with each other at the initial position as illustrated in FIG. 8, and a gap CL1 is formed between the inner peripheral surface and the outer peripheral surface of the semiconductor device 26 as illustrated in the same figure.

The engagement between the protrusions 60d and 60e and the recessed portions 64ga and 64gb may be adapted such that they are not fixed completely, and even with any backlash the accommodation portion 60M of the positioning member 60 and the outer periphery of the semiconductor device 26 do not interfere with each other.

An inner peripheral surface of the positioning member 60 forming the accommodation portion 60M is formed, surrounded by a first surface 60f, with which end surfaces of the whole periphery of the semiconductor device 26 are in contact, slope 60s that combines an upper end surface of the semiconductor device and the flat surface 60f, and an bottom surface 60b intersecting the flat surface 60f. A mutual distance between the opposing flat surfaces 60f is set such that a predetermined gap is formed between the outer peripheral surface of the semiconductor device 126 and the flat surface of the same.

When in such a structure, the semiconductor device 26 is held with the hand HA of the conveyance robot and is in a state just before it is accommodated in the accommodation portion 60M of the positioning member 60, the semiconductor device 26 is held on the tip end of the hand HA of the conveyance robot such that the axial center of the hand HA of the conveyance robot and the center of the semiconductor device 26 are coincident with each other, as illustrated in FIG. 8.

Subsequently, when the held semiconductor device 26 is mounted in the accommodation portion 60M, the frame member 22 is first lowered up to a lowest end position illustrated in FIG. 9 against the energizing force of a coiled spring with the aid of the press portion PU of the conveyance robot.

The contact deviation member 68 is hereby moved against the energizing force of the energizing means from a state illustrated in FIG. 8 to a state illustrated in FIG. 9. Accordingly, the partition wall 68P is moved such that the movable contact 36M of each contact terminal 36ai is separated from the movable contact 36F.

Then, in the state of the partition wall 68P where the movable contact 36M of each contact terminal 36ai is separated from the movable contact 36F, the semiconductor device 26 is placed on the bottom of the accommodation portion 60M of the positioning member 60 as indicated by a chain double-dashed line in FIG. 9, and the outer periphery thereof is restricted in its position to position the electrode 26a of the semiconductor device 26 between the movable contact of each contact terminal 36ai and the movable contact 36F of the same.

In this situation, since the center position of the accommodation portion 60M is coincident with the axis center of the hand HA of the conveyance robot, there is no possibility of the outer periphery of the semiconductor device 236 interfering with the inner periphery of the accommodation portion 60M of the positioning member 60.

Successively, the semiconductor device 26 is demounted from the hand HA of the conveyance robot.

When the frame member 22 is raised as illustrated in FIG. 19 in the state where each electrode 26a of the semiconductor device 26 is disposed between the movable contacts 36M and 36F of each contact terminal 36ai, the contact deviation member 68 is moved up to the initial position with the aid of the energizing force of the energizing means and the restoring force of then movable contact 36M, whereby the partition wall 68P is separated from the movable contact 36M and makes contact with the movable contact 36F. It is noticed that FIG. 10 illustrates the state of the contact deviation member 68 just after the contact deviation member 68 is moved in the direction indicated by an arrow in the same figure in the state where the partition wall 68P does not make contact with the movable contact 36F.

As illustrated in FIG. 10, each electrode 26a of the semiconductor device 26 is therefore electrically connected with each contact terminal 36ai by holding each electrode 26a of the semiconductor device 26 between the movable contacts 36M and 36F of each contact terminal 36ai. Thereupon, the one end of the outer periphery of the semiconductor device 26 is brought into close vicinity to the flat surface 60f of the positioning member 60 with a predetermined gap CL2 with the aid of the restoring force of the movable contact 36M. Herein, since the gap CL2 is formed as illustrated in FIGS. 9 and 10, differing from the situation in the aforementioned embodiments where the position of the one end of the outer periphery of the semiconductor device 26 is the contact position indicated by a chain double-dashed line in FIG. 9, undesirable interference between the semiconductor device 26 and the flat surface 60f of the positioning member 60 owing to manufacturing error on a relative position with respect to the socket body 64 of the positioning member 60 is avoided.

Upon a tested semiconductor device 26 being demounted from the accommodation portion 60M after a predetermined test is finished, and a new semiconductor device 26 being mounted in the accommodation portion 60M, the elevation of the frame member 22 described above is again performed, and the tested semiconductor device 26 is held with the hand HA of the conveyance robot and is demounted.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor device-socket comprising:
   a supporting member for supporting a proximal end of a contact terminal including a movable contact that selectively makes contact with a terminal of a semiconductor device for electrical connection thereto;

a contact terminal deviation member disposed movably in said supporting member, said contact terminal deviation member including a press portion for bringing said movable contact of said contact terminal into or out of close proximity to the terminal of said semiconductor device;

a first positioning member supported on said supporting member with the movement in the direction of the movement of said contact terminal deviation member restricted, said first positioning member including an accommodation portion for positioning the terminal of said mounted semiconductor device relatively with respect to said movable contact of said contact terminal; and a second positioning member opposing to said first positioning member and supported on said supporting member movably in the direction of the movement of said contact terminal deviation member, said second positioning member including a accommodation portion for positioning the terminal of said mounted semiconductor device relatively with respect to said movable contact of said contact terminal cooperatively with said first positioning member.

2. A semiconductor device-socket as claimed in claim 1 wherein said second positioning member includes an engagement portion selectively engaged with said contact terminal deviation member when said contact terminal deviation member is moved, and is moved as to bring into or out of close proximity to said first positioning member.

3. A semiconductor device-socket as claimed in claim 1 wherein when said first positioning member and said second positioning member are brought into close proximity to each other to form said accommodation portion, substantially the center position of said mounted semiconductor device and substantially the center position of said accommodation portion are coincident with each other, and a predetermined gap is formed between the outer periphery of said semiconductor device and the wall surface forming said accommodation portion.

4. A semiconductor device-socket as claimed in claim 1 wherein said contact terminal includes said movable contact composed of a first movable contact and a second contact movable contact which is brought into or out of close proximity to each other in response to the movement of said contact terminal deviation member.

5. A semiconductor device-socket as claimed in claim 4 wherein said terminal of the semiconductor device is selectively supported between said first movable contact and second movable contact of said contact terminal to be electrically connected with said terminal of the semiconductor device.

6. A semiconductor device-socket comprising:

a supporting member for supporting a proximal end of a contact terminal including a movable contact that selectively makes contact with a terminal of a semiconductor device for electrical connection thereto;

a contact terminal deviation member disposed relatively movably in said supporting member, said contact deviation member including a press portion for bringing said movable contact of said contact terminal into or out of close proximity to the terminal of the semiconductor device;

a positioning member supported on said supporting member with the movement in the direction of the movement of said contact terminal deviation member restricted, said positioning member including an accommodation portion for relatively positioning the terminal of said semiconductor device with respect to said movable contact to accommodate said semiconductor device; and a position restriction member for restricting the movement of said positioning member in the direction of the movement of said contact terminal deviation member when said semiconductor device is mounted in the accommodation portion of said positioning member.

7. A semiconductor device-socket as claimed in claim 6 wherein said positioning member is a resilient member for urging said positioning member in one direction along the direction of the movement of said contact terminal deviation member.

8. A semiconductor device-socket comprising:

a supporting member for supporting a proximal end of a contact terminal including a movable contact that selectively makes contact with a terminal of a semiconductor device to be electrically connected with the terminal of the semiconductor device;

a contact terminal deviation member disposed relatively movably in said supporting member, said contact terminal deviation member including a press portion for bringing said movable contact of said contact terminal into or out of close proximity to the terminal of said semiconductor device; and a positioning member supported on said supporting member with the movement in the direction of the movement of said contact terminal deviation member restricted, said positioning member including an accommodation portion for relatively positioning and accommodating the terminal of said semiconductor device placed on the bottom with respect to said movable contact.

* * * * *

UNITED STATES PATENT AND TRADEMARK OFFICE
CERTIFICATE OF CORRECTION

PATENT NO. : 6,707,309 B2
DATED : March 16, 2004
INVENTOR(S) : Masaru Sato et al.

It is certified that error appears in the above-identified patent and that said Letters Patent is hereby corrected as shown below:

<u>Column 17</u>,
Line 19, "a accommodation" should read -- an accommodation --.
Lines 42-43, "second contact moveable contact" should read -- second movable contact --.

Signed and Sealed this

Sixteenth Day of November, 2004

JON W. DUDAS
*Director of the United States Patent and Trademark Office*